(12) United States Patent
Mitra et al.

(10) Patent No.: US 10,637,472 B1
(45) Date of Patent: Apr. 28, 2020

(54) REFERENCE VOLTAGE GENERATION FOR CURRENT MODE LOGIC

(71) Applicant: Advanced Micro Devices, Inc., Santa Clara, CA (US)

(72) Inventors: Aditya Mitra, Bangalore (IN); Animesh Jain, Bangalore (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/418,676

(22) Filed: May 21, 2019

(51) Int. Cl.
*H03K 17/16* (2006.01)
*H03K 19/00* (2006.01)
*H03K 19/003* (2006.01)
*H03K 19/0185* (2006.01)

(52) U.S. Cl.
CPC ... *H03K 19/0013* (2013.01); *H03K 19/00315* (2013.01); *H03K 19/018528* (2013.01)

(58) Field of Classification Search
CPC ......... H03K 19/0013; H03K 19/00315; H03K 19/018528
See application file for complete search history.

(56) References Cited

U.S. PATENT DOCUMENTS

| | | | | |
|---|---|---|---|---|
| 6,653,694 B1* | 11/2003 | Osanai | ................ | H01L 27/0883 257/392 |
| 7,486,129 B2* | 2/2009 | Pietri | ...................... | G05F 3/245 327/539 |
| 9,235,229 B2* | 1/2016 | Zhang | ....................... | G05F 3/30 |
| 10,133,292 B1* | 11/2018 | Summers | ................ | G05F 3/26 |
| 10,198,023 B2* | 2/2019 | Yoshino | .................. | G05F 3/262 |
| 2010/0127687 A1* | 5/2010 | Boas | ......................... | G05F 3/16 323/311 |
| 2017/0185097 A1* | 6/2017 | Kundu | ..................... | G05F 3/262 |
| 2018/0375507 A1* | 12/2018 | Elsayed | ............... | H03K 19/003 |

* cited by examiner

*Primary Examiner* — Alexander H Taningco
*Assistant Examiner* — Kurtis R Bahr
(74) *Attorney, Agent, or Firm* — Polansky & Associates, P.L.L.C.; Paul J. Polansky; Nathan H. Calvert (57) ABSTRACT

A reference voltage generation circuit for use with current mode logic includes a first transistor of a first conductivity type configured to operate as a diode-connected resistor with a source terminal coupled to a first voltage supply terminal for conducting a supply voltage and a gate terminal coupled to a drain terminal. Second and third transistors of a second conductivity type are coupled in series between the drain terminal of the first transistor and a second voltage supply terminal. Gate terminals of the second and third transistors coupled to the gate terminal of the first transistor. A reference voltage is obtained between the second and third transistors. The first and second NMOS transistors are sized such that they remain in sub-threshold mode operation during operation with an expected range of the supply voltage. Current mode logic circuits are also provided using the reference voltage generation circuit.

20 Claims, 7 Drawing Sheets

REFERENCE VOLTAGE GENERATION FOR CURRENT MODE LOGIC

BACKGROUND

Modern SOCs (System-On-Chip) use high-speed clock generators in many locations across the chip, requiring a high-quality reference clock. The reference clock (REFCLK) for an SOC is generally sourced from an off-chip crystal or some other such source. It is important that the REFCLK signal is distributed across the chip with minimal jitter. For that distribution, a CML (Current Mode Logic) circuit is preferred for repeaters/buffers as it introduces less voltage-dependent jitter compared to other CMOS clock distribution solutions.

Though a CML circuit topology generally has less sensitivity to power supply fluctuations compared to a CMOS topology, it is still sensitive to voltage changes and hence it is preferred to connect the power pins of CIVIL circuits to a regulated power supply that is stable with less variation. But such a regulated supply is difficult to distribute all over the chip as needed for these clock distribution circuits. Therefore, SOC designers are often forced to connect CML circuits to other voltage supplies which have higher dynamic fluctuations and higher operating range across all conditions and workloads.

A wide variation in the supply voltage not only makes it difficult to function without errors at lower supply voltages, but more importantly degrades jitter performance of traditional CIVIL circuits like CIVIL buffers and CML receivers (CIVIL to CMOS converter).

One way these issues are addressed in the art is by restricting the placement of CML buffers to only areas where a regulated supply is available, and adjusting the clock distribution tree accordingly. The circuits which receive the clock may be moved in some cases if possible. This solution poses heavy limitations in overall floorplanning of the chip and results in a sub-optimized clock distribution network.

Another solution is to generate a stable voltage reference like BGR (Band Gap Reference) that can be used to produce a constant current that is not very sensitive to power supply fluctuations. This option is not viable for lower power supplies that are normally targeted in SOCs for battery power optimization and other power management features.

A third solution is to use a simple resistor-divider derived reference voltage. This option results in higher (above optimal) jitter in each CML buffer circuit, thereby restricting the maximum number of repeaters allowed in a distribution path, and restricting the sharing of CML lines across various corners of the chip that need reference clock.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A reference voltage generation circuit is for use with current mode logic. The reference voltage generation circuit includes a first transistor of a first conductivity type configured to operate as a diode-connected resistor with a source terminal coupled to a first voltage supply terminal for conducting a supply voltage and a gate terminal coupled to a drain terminal. Second and third transistors of a second conductivity type are coupled in series between the drain terminal of the first transistor and a second voltage supply terminal, with gate terminals of the second and third transistors coupled to the gate terminal of the first transistor. An output terminal is coupled between the second and third transistors for supplying a reference voltage. The second and third transistors are sized such that they remain in sub-threshold mode operation during operation with an expected range of the supply voltage.

A current mode logic driver circuit has reference voltage capability and includes a current reference branch, a voltage reference branch, an operational amplifier, and a current mode logic output stage. The current reference branch includes a first transistor having a source terminal coupled to a first supply voltage terminal for conducting a supply voltage, a drain terminal connected to one or more series resistors, and a gate terminal coupled to an input terminal. The voltage reference branch includes (i) a first transistor of a first conductivity type configured to operate as a diode-connected resistor with a source terminal coupled to a supply voltage and a gate terminal coupled to a drain terminal, (ii) second and third transistors of a second conductivity type coupled in series between the first transistor and a second supply voltage terminal, with gate terminals of the second and third transistors coupled to the gate terminal of the first transistor, and (iii) an output terminal coupled between the second and third transistors for supplying a reference voltage. The second and third transistors are sized such that they remain in sub-threshold mode during operation of the voltage reference branch with an expected range of the supply voltage. The operational amplifier has a negative input terminal coupled to the output terminal of the voltage reference branch, a positive input terminal coupled to a positive terminal of one of the one or more series resistors of the current reference branch, and an output terminal coupled to the input terminal of the current reference branch. The current mode logic output stage includes a bias voltage input terminal coupled to the output terminal of the operational amplifier to create a current mirror to the current reference branch, first and second voltage input terminals, and first and second differential output terminals for driving a differential load.

A method generates a reference voltage for a current mode logic circuit. The method includes applying a supply voltage to a series combination of a first transistor of a first conductivity type followed by second and third transistors of a second conductivity type. The first transistor is operated in a diode-connected resistor configuration with its gate terminal connected to its drain terminal. The second and third transistors are operated in a subthreshold region of operation with gate terminals of the second and third transistors coupled to the gate terminal of the first transistor. The supply voltage to is allowed vary under load and temperature variations while the second and third transistors are maintained in the subthreshold region of operation across an expected range of supply voltage variation. While operating the second and third transistors in the subthreshold region of operation, a reference voltage is obtained between the second and third transistors substantially independent of the supply voltage variation.

Figure 1:
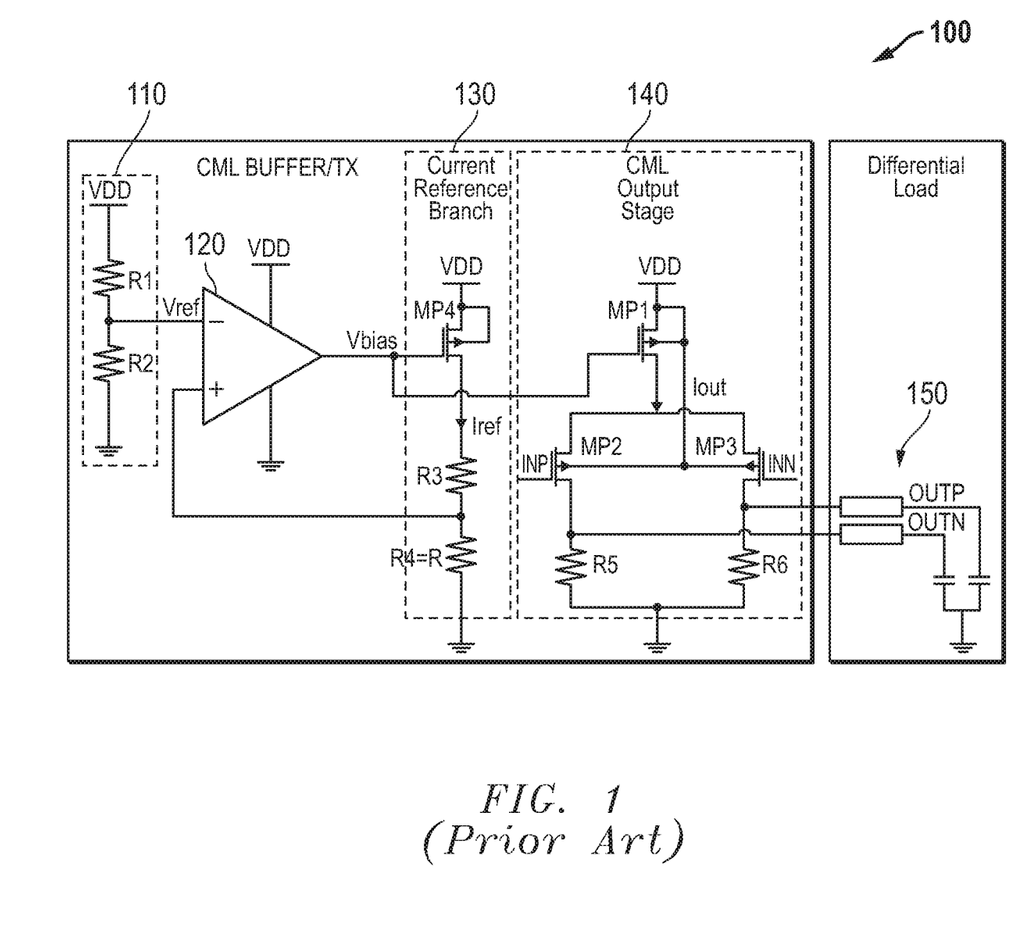
FIG. 1 illustrates in circuit diagram form a current mode logic buffer circuit known in the prior art.

FIG. 1 illustrates in circuit diagram form a current mode logic (CML) buffer circuit 100 known in the prior art. A reference voltage Vref is provided by the voltage divider of resistors R1 and R2 dividing the supply voltage VDD. The resulting Vref varies when supply voltage VDD varies. CIVIL buffer circuit 100 uses the reference voltage to generate a reference current in current reference branch 130, controlled with feedback through operational amplifier ("op amp") 120. Current reference branch 130 acts as a current mirror with transistor MP1 in the CIVIL output stage 140. This current mirror ensures a stable signaling current is provided for differential CML signaling over a transmission line represented by differential load 150. As discussed above, the use of a voltage divider to produce reference voltage Vref increases the jitter, or timing variation, of the buffer circuit when compared to a more stable Vref.

Figure 2:
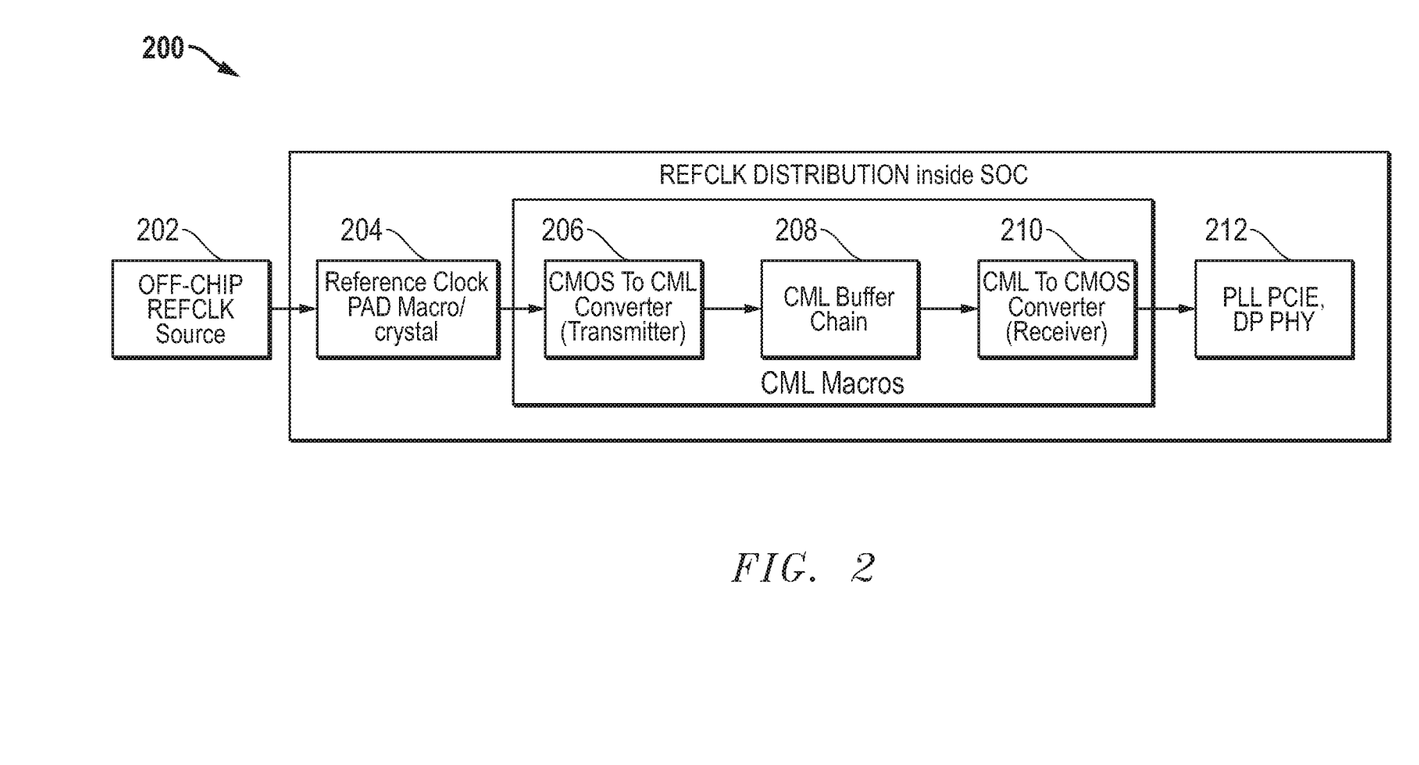
FIG. 2 illustrates in block diagram form reference clock distribution system for a system-on-chip according to some embodiments.

FIG. 2 illustrates in block diagram form a reference clock distribution system 200 for a system-on-chip according to some embodiments. The depicted system 200 illustrates one context in which CIVIL buffer circuits such as those herein are employed. A reference clock signal REFCLK is produced by a source 202, which is typically an off-chip crystal oscillator but may be any suitable clock generation module. The REFCLK signal is fed into a system-on-chip (SoC) 201 through reference pad Reference Clock PAD macro/crystal 204. At this stage the REFCLK signal is in a single-ended/differential form in which the clock signal varies relative to ground or the more-negative supply voltage. Then the REFCLK signal is converted to current mode logic signaling (differential signaling) and distributed with a series of CIVIL macros or circuit blocks. The conversion is done by a CMOS to CML converter (transmitter) block 206, which receives the REFCLK signal in single-ended or differential form and converts it to CML. Block 206 may include the circuit of FIG. 3.

From block 206, the REFCLK signal in differential form is fed to a CIVIL buffer chain 208, which includes multiple CIVIL buffers as described herein. CIVIL buffer chain 208 is arranged with the output of the first buffer feeding to the input of the second buffer and so on. The buffers are typically positioned on the SoC where distance requires a new buffer to be added. Where a single-ended clock signal or other differential form is needed for operation on the chip, the differential signal is converted by a CML to CMOS converter (receiver) block 210, which converts the REFCLK signal to a single-ended or other differential format suitable for digital logic such as CMOS logic. This converted signal is then fed to a circuit block 212, which may be any circuit requiring a reference clock, such as a peripheral component internet express (PCIE) phased lock loop circuit (PLL) or a Display Port (DP) physical layer circuit (PHY) as depicted.

Figure 3:
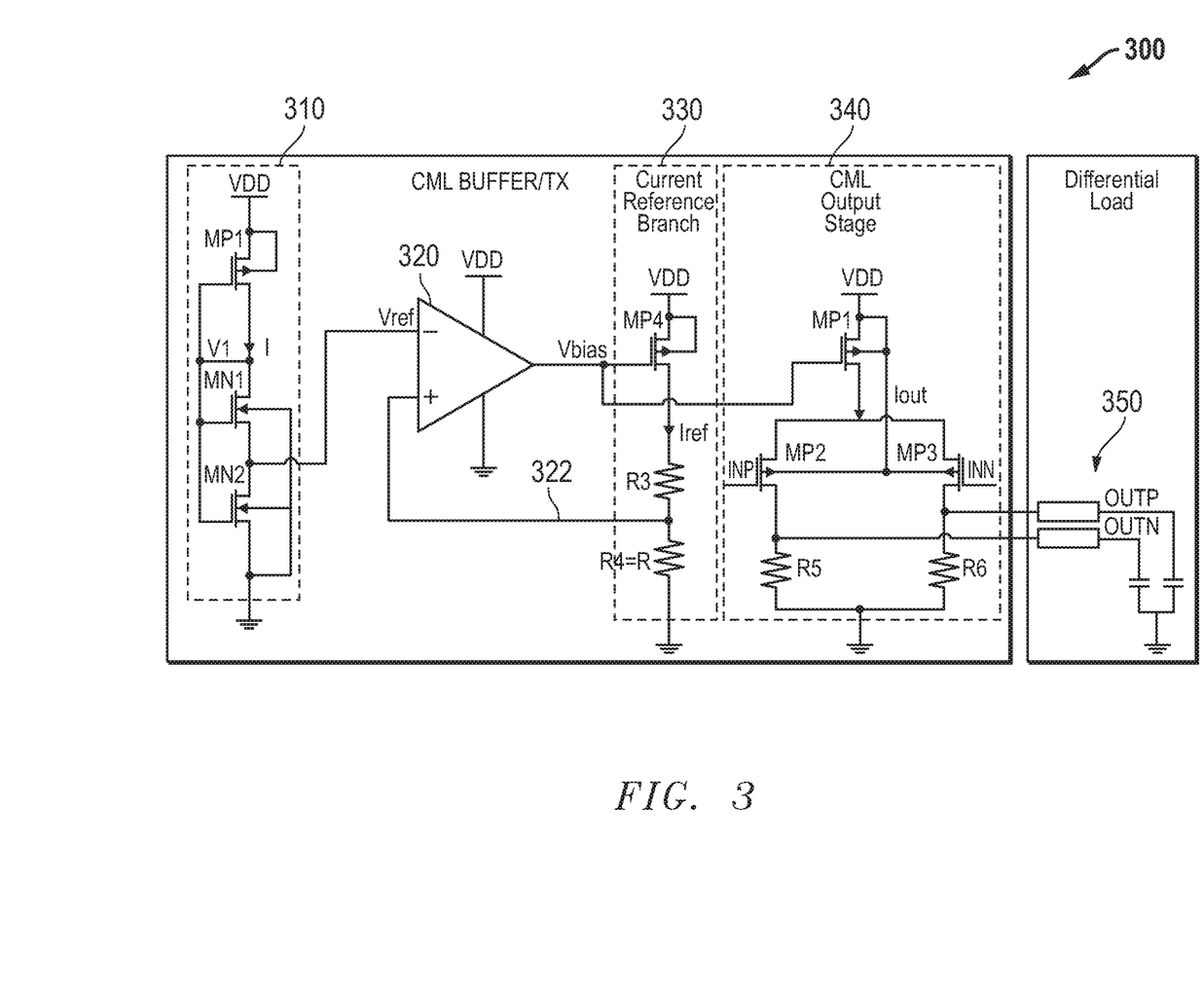
FIG. 3 illustrates in circuit diagram form a CML buffer circuit according to some embodiments.

FIG. 3 illustrates in circuit diagram form a CML buffer circuit 300 according to some embodiments. The depicted CML buffer circuit may be used in a CML transmitter circuit such as CML converter (transmitter) 206 of FIG. 2, as a CML buffer or repeater such as those in CML buffer chain 208, or in the CIVIL to CMOS converter (receiver) block 210. CML buffer circuit 300 generally includes a reference voltage generation circuit 310, a current reference branch 330 with a feedback control op amp 320, and a CML output stage 340.

Reference voltage generation circuit 310 includes a first transistor MP1 of a first conductivity type, which in this example is a PMOS transistor. Transistor MP1 is configured to operate as a diode-connected resistor with the source terminal coupled to the supply voltage VDD, and the gate terminal coupled to the drain terminal at the node labeled V1. Second and third transistors MN1 and MN2 of a second conductivity type (in this example, NMOS) are coupled in series between the drain terminal of the first transistor and ground, or the more-negative supply terminal for supply voltage VDD, with gate terminals of the second and third transistors coupled to the gate terminal of the first transistor. An output terminal is coupled between the second and third transistors for supplying the reference voltage Vref. The second and third transistors are sized such that they remain in sub-threshold mode operation during operation with an expected range of the supply voltage VDD.

The reference voltage generation circuit 310 may be used with other CML circuits or analog circuits that require a stable reference voltage. In the depicted circuit, CML buffer circuit 300 uses the reference voltage to generate a reference current in current reference branch 330, controlled with feedback through an op amp 320. The current reference branch acts as a current mirror with the CIVIL output stage 340. This current mirror ensures a stable signaling current is provided for CIVIL signaling over the transmission line represented by the differential load.

Op amp 320 has a negative input terminal, a positive input terminal, and an output terminal having an output voltage Vbias. The negative input terminal receives reference voltage Vref produced by reference voltage generation circuit 310. The positive input terminal of op amp 320 is connected to node 322 to receive a feedback voltage signal produced by current reference branch 330.

Current reference branch 330 includes a transistor MP4 having a source terminal coupled to the supply voltage VDD, a drain terminal connected to a voltage divider of two series resistors R3 and R4, and a gate terminal coupled to an input terminal for current reference branch 330, which is connected to the output terminal of op amp 320 to receive voltage Vbias. A voltage divider formed by resistors R3 and R4 is fed with a current Iref from the drain of transistor MP4. Current Iref flows from supply voltage VDD through the source and drain of transistor MP4 and through resistors R3 and R4 to ground.

In operation, current reference branch 330 is controlled by op amp 320 through the connection of voltage Vbias to the gate of transistor MP4. Op amp 320 is differentially driven by voltage Vref and the feedback voltage on node 322. Because of this feedback, op amp 320 and transistor MP4 form a negative feedback loop to keep current Iref at a constant level. For example, with Vref at a constant level, when the voltage at node 322 increases, voltage Vbias decreases, causing current Iref to decrease. As a result, the voltage on node 322 decreases. The negative feedback loop maintains voltage Vbias and current Iref at a corresponding constant level. The negative feedback loop also serves to control the current through CIVIL output stage 340.

CML output stage 340 acts as a CML differential driver and includes a transistor MP1 with a source terminal connected to supply voltage VDD, and a drain terminal connected in parallel to the drain terminals of two driver transistors MP2 and MP3. The gate of transistor MP1, which is a bias voltage input terminal for CML output stage 340, is connected to the output terminal of op amp 320 to create a current mirror to the current reference branch. The gates of driver transistors MP2 and MP3 are connected respectively to first and second voltage input terminals INP and INN. The source terminal of driver transistor MP2 is connected to resistor R5, and connected in parallel to differential output terminal OUTN. Resistors R5 and R6 are connected at their terminals opposite the driver transistors to ground. The source terminal of driver transistor MP3 is connected to resistor R6, and connected in parallel to differential output terminal OUTP. Differential output terminals OUTP and OUTN are connected to output pads linking to a differential transmission line, or to traces designed for on-chip transmission to a destination buffer or receiver, represented by differential load 350.

In operation, CML buffer circuit 300 may be configured as transmitter, receiving a single-ended signal on the first and second voltage input terminals INP and INN, and transmitting a differential output signal on the first and second differential output terminals OUTP and OUTN. CIVIL buffer circuit 300 may also be configured as a repeater, receiving a differential input on the first and second voltage input terminals INP and INN, and transmitting a differential output signal on the first and second differential output terminals OUTP and OUTN.

Figure 4:
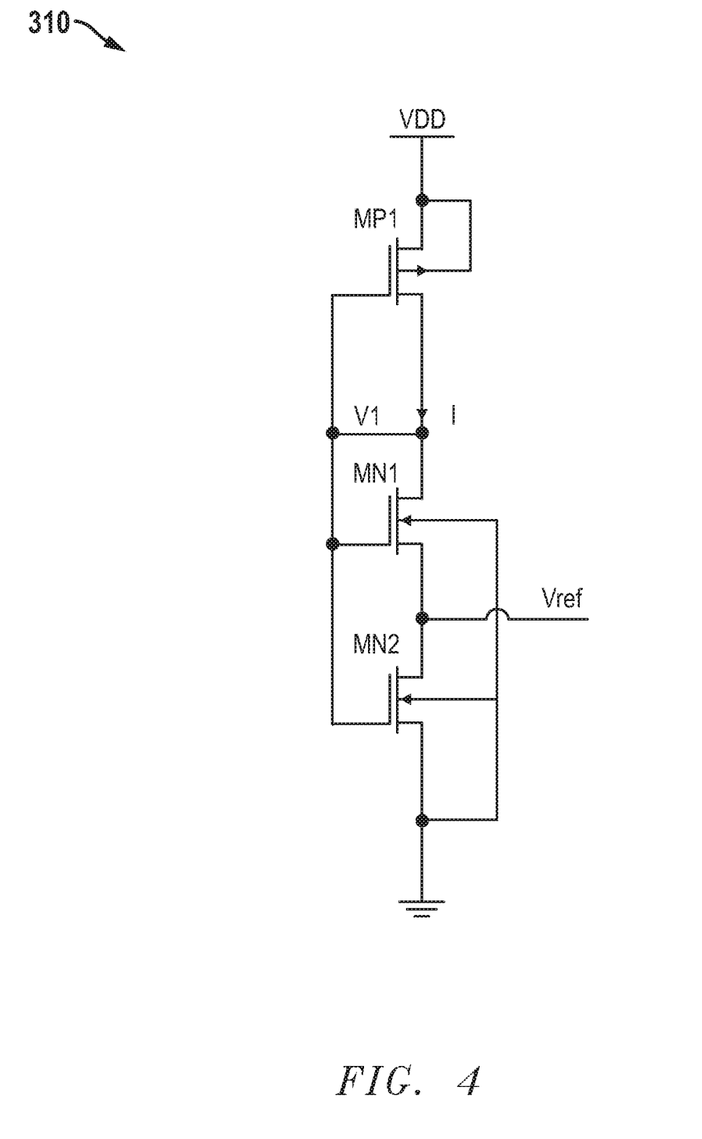
FIG. 4 illustrates in circuit diagram form an enlarged view of the reference voltage generation circuit of FIG. 3.

FIG. 4 illustrates in circuit diagram form an enlarged view of the reference voltage generation circuit 310 of FIG. 3. Reference voltage generation circuit 310 may be used in CML buffer circuits and other CIVIL circuits or analog circuits that require a reference voltage. As discussed above, reference voltage generation circuit 310 is constructed to keep transistors MN1 and MN2 biased in the sub-threshold region as the supply voltage varies across its full range of operation. The current I through an NMOS transistor in the subthreshold region can be given by a subthreshold current equation, Equation 1:

$$I = K \frac{W}{L} e^{\frac{Vgs-Vth}{\eta VT}} \quad (1)$$

Constant K is the transconductance coefficient for each transistor, given by $\mu_n C_{ox}$, where $\mu_n$ is the surface mobility of electrons in the transistor channel, and $C_{ox}$ is the density of gate oxide capacitance. W and L are the width and length of the transistor channel. $V_{gs}$ is the gate to source voltage on the transistor. $V_{th}$ is the threshold voltage. $V_t$ is the thermal voltage defined by KT/q, and $\eta$ is the subthreshold ideality factor.

The current I through reference voltage generation circuit 310 is identical in MN1 and MN2, and can be given by the Equation 2:

$$I = K1 \frac{W1}{L1} e^{\frac{V1-Vref-Vth}{\eta VT}}, I = K2 \frac{W2}{L2} e^{\frac{V1-Vth}{\eta VT}} \quad (2)$$

V1 is the voltage on the drain of transistor MN1 (and on the device gates). Because the current is the same through both MN1 and MN2, the reference voltage Vref may therefore be found by solving for Equation 2 for Vref, as shown in Equation 3:

$$Vref = \eta VT \ln\left[\frac{K1\left(\frac{W1}{L1}\right)}{K2\left(\frac{W2}{L2}\right)}\right] \quad (3)$$

As can be seen, the voltages V1 and $V_{th}$ cancel out of the expression for Vref, and the supply voltage VDD does not appear in the expression. Vref is therefore kept independent of supply voltage as long as MN1 and MN2 are biased in sub-threshold region. In this condition, when the supply voltage varies, the voltage drop across transistor MP1 varies, but the Vref voltage is held substantially stable.

To help achieve the condition of sub-threshold operation, several design considerations may be followed for transistors MP1 and transistors MN1 and MN2. First, the device cell type for transistors MP1 and MN1, MN2 should be selected to be either HVT (high voltage threshold) or RVT/SVT (standard voltage threshold). This selection makes it easier to maintain sub-threshold operation. Next, the device sizes should be chosen according to the desired Vref. For design purposes, the equations above may be used with the threshold voltage, which is temperature dependent, set at room temperature. Vref from Equation 3 above can also be expressed by Equation 4:

$$Vref = (KT/q)\ln\left[\frac{K1\left(\frac{W1}{L1}\right)}{K2\left(\frac{W2}{L2}\right)}\right] \quad (4)$$

In Equation 4, T is the temperature of the transistors and q is the charge of an electron. For an example process, evaluating KT/q gives a value of 26 mV at room temperature. If a Vref is desired to be near 100 mV, for example, then ln[(W1/L1)/(W2/L2)] should be approximately equal to 4. (K1 and K2 are typically equal and cancel each other out of the equation.) This result requires (W1/L1)/(W2/L2)=54. If L1 and L2 are chosen to be same, then W1/W2=54. This ratio provides an area advantage compared to solutions that use resistors because a CMOS transistor with a 54 multiplier on the width is typically smaller than a resistor would be for the same process. Generally, the ratio (W1/L1)/(W2/L2) will be set to at least 30, more preferably at least 40, and even more preferably at least 50. If a higher Vref is desired, a higher (W1/L1)/(W2/L2) ratio may be used. Different values for L1 and L2 may also be chosen.

For situations where high supply voltages are used, such as supplies around 1.8V or higher, the techniques herein may still be employed, but may yield less of an advantage over prior solutions using bandgap reference (BGR) structures to produce a reference voltage. If a high supply voltage is desired, transistor MP1 should be designed to have a high Rds (drain to source resistance). Transistor MP1 may be replaced with a stacked PMOS transistor, stacking two or three devices to increase the effective L of transistor MP1 and thereby increase the Rds. The gates of the stacked transistors are tied together. Transistor MP1 may also be augmented with a second diode-connected transistor in series between MP1 and supply voltage VDD. The gate of the second transistor is connected between to its drain, which connects to the source of MP1. Either of these techniques may help provide a higher resistance before MN1 and MN2, dropping a higher percentage of supply voltage where a high supply voltage is used. With moderate or high supply voltages, the sizing of transistor MP1 should be chosen sufficiently small so that Rds of transistor MP1 is sufficiently high to drop the voltage V1 less than the Vth of MN2. While these considerations allow use with high supply voltages, the techniques herein yield more advantages in CML buffer circuits, and other analog circuits, with a low supply voltage. BGR solutions typically will not work, for example, with a low supply voltage of approximately 0.6V, while the present solution functions well and has very little variation from supply voltage changes.

Figure 5:
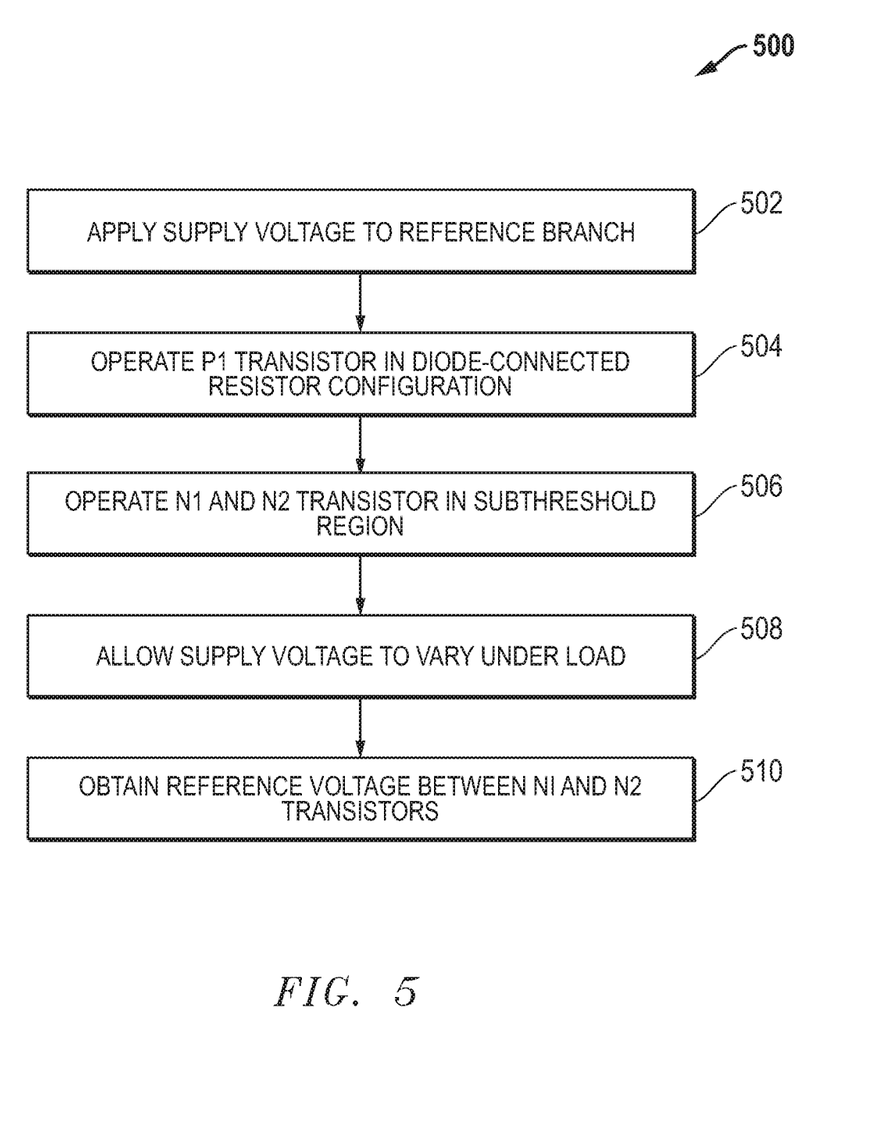
FIG. 5 shows in flow diagram form a process by which a reference voltage generation circuit, such as that of FIG. 4, is operated.

FIG. 5 shows in flow diagram form a process 500 by which a reference voltage generation circuit, such as that of FIG. 4, is operated. While the process blocks are shown in order for reference, typically the various parts of the process occur simultaneously as the reference voltage generation circuit operates. Process 500 begins at block 502 where the supply voltage is applied to the circuit branch of the reference voltage generation circuit. Block 502 includes applying the voltage to a series of a first transistor of a first conductivity type followed by second and third transistors of a second conductivity type. As shown at block 504, the first transistor is operated in a diode-connected resistor configuration with its gate terminal connected to its drain terminal. At block 506, the second and third transistors are operated in a sub-threshold region of operation with gate terminals of the second and third transistors coupled to the gate terminal of the first transistor. The supply voltage is allowed to vary under load and temperature variations as shown at block 508. This block includes maintaining the second and third transistors in the subthreshold region of operation across an expected range of supply voltage variation. While operating the second and third transistors in the subthreshold region of operation, at block 510 the process obtains the reference voltage between the second and third transistors, with the reference voltage substantially independent of the supply voltage variation.

Figure 6:
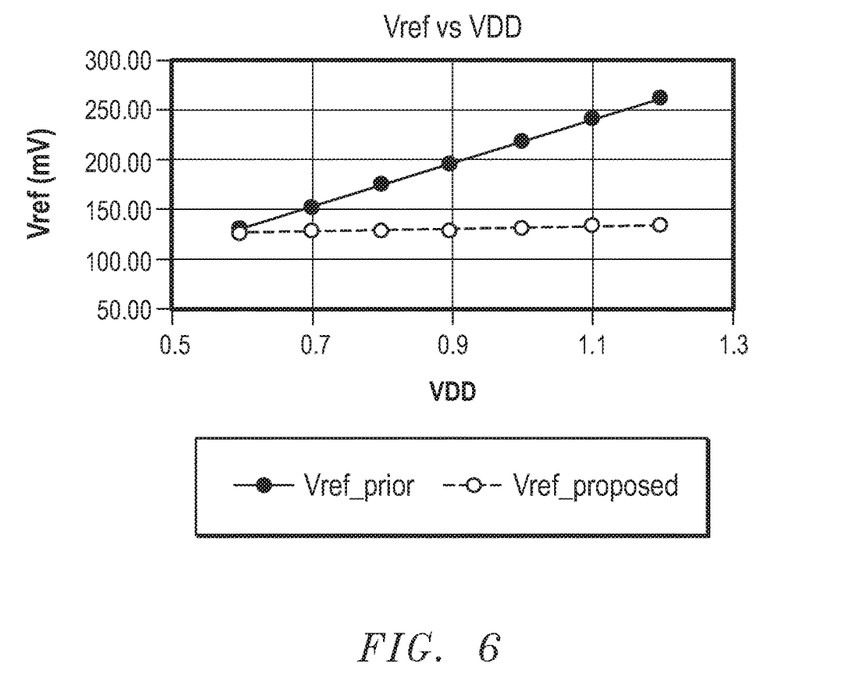
FIG. 6 shows a chart comparing reference voltage variation for the prior art circuit of FIG. 1 and the circuit of FIG. 3.

FIG. 6 shows a chart comparing Vref variation for the prior art circuit of FIG. 1 and the circuit of FIG. 3. The supply voltage VDD is varied as shown on the horizontal axis, with the resulting Vref values shown along the vertical axis. The prior art circuit varies the Vref from 131.7 mV at a VDD of 0.6V, to 263 mV at a VDD of 1.2V, a variation of 131.3 mV. The circuit of FIG. 3 varies the Vref from 127.9 mV at a VDD of 0.6V, to 134.4 mV at a VDD of 1.2V, a variation of 6.5 mV. This variation provides a substantial improvement in performance over the prior art, enabling variation to be under 10 mV, or more preferably under 7 mV, for supply variations from 0.6V to 1.2V. The variation is even less when considering the low end of supply voltage range, varying only to 130.4 mV from 127.9 mV, a variation of only 2.5 mV. Such a low Vref variation allows much better jitter performance, and therefore much tighter design thresholds for timing and voltage across the CIVIL portions of the system. Such variation provides a reference voltage that is substantially independent of the supply voltage variation. By substantially independent, it is meant generally that the reference voltage is so stable that can be treated as independent without making accommodations for variation. For example, variations of less than 3% meet such a criterion for CML signaling circuits because tolerances allow greater swings without affecting the driver circuit performance. Generally variations of 5% will meet this criterion.

Figure 7:
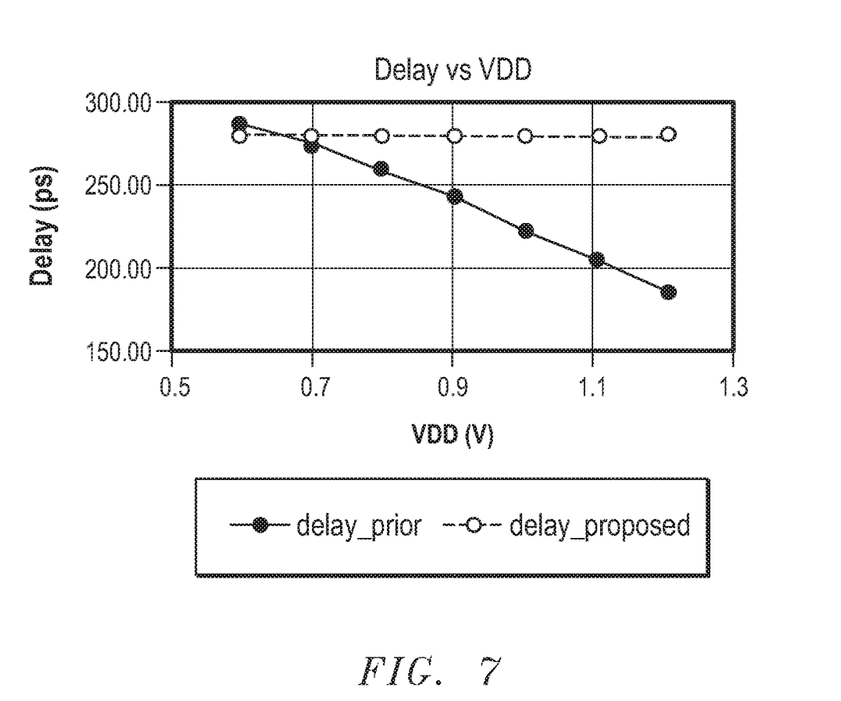
FIG. 7 shows a chart comparing delay time variation of transmitting an input signal to the differential outputs for the circuits FIG. 1 and FIG. 3.

FIG. 7 shows a chart comparing delay time variation of transmitting an input signal to the differential outputs for the circuits FIG. 1 and FIG. 3. Again, the supply voltage VDD is varied as shown on the horizontal axis, with the resulting delay values shown along the vertical axis in picoseconds. The prior art circuit varies the delay from 284.2 ps at a VDD of 0.6V, to 182.6 ps at a VDD of 1.2V, a variation of 101.6 ps. The circuit of FIG. 3 varies the Vref from 277.4 ps at a VDD of 0.6V, to 275.3 ps at a VDD of 1.2V, a variation of 2.1 ps. At the low end of supply voltage range the circuit of FIG. 3 varies its delay only 1.1 ps as VDD changes from 0.6V to 0.8V, while the prior art circuit varies more than 28 ps over the same range. As can be understood from the depicted performance, the techniques herein allow the CML buffer circuit to maintain a delay variation of less than 5 ps as the supply voltage varies from 0.6V to 1.2V. An even tighter variation can be maintained along a lower range of supply voltage variation, such as less than 3 ps as the supply voltage varies from 0.6V to 1V, or less than 2 ps as the supply voltage varies from 0.6V to 0.8V. A less than 1 ps variation can be maintained as the supply voltage varies from 0.8V to 1V. Such timing variation, or jitter, is an important performance metric for signaling circuits such as the CML buffer compared here.

Figure 8:
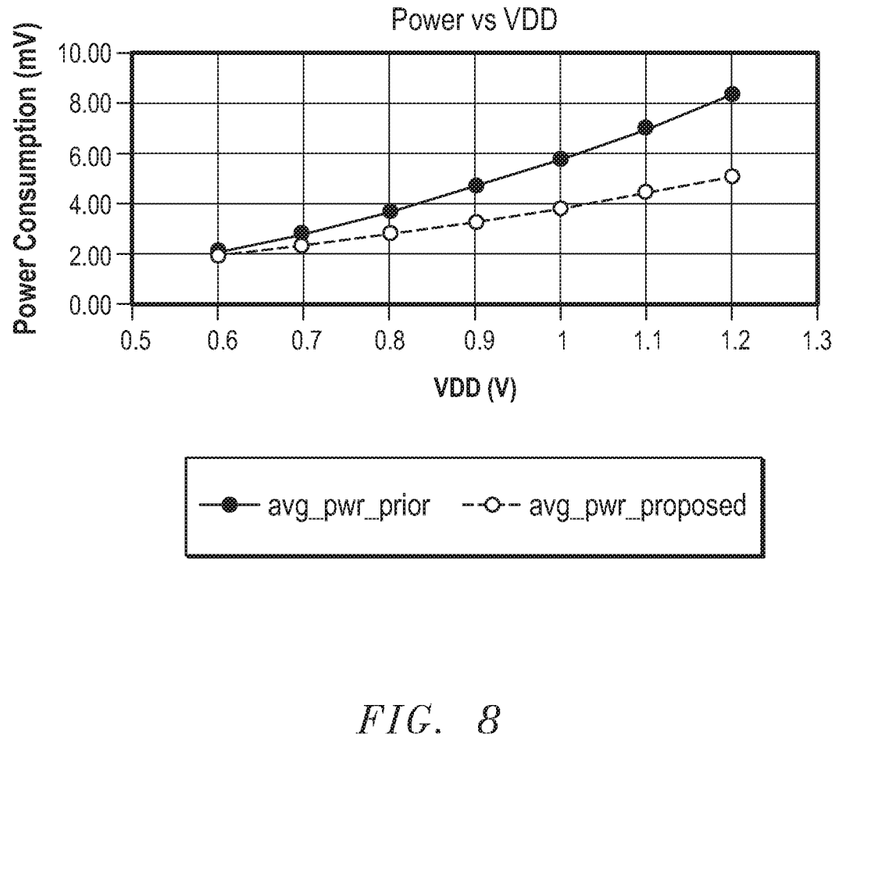
FIG. 8 shows a chart comparing power consumption of the circuits of FIG. 1 and FIG. 3 as the supply voltage varies.

FIG. 8 shows a chart comparing power consumption of the circuits of FIG. 1 and FIG. 3 as the supply voltage VDD varies. The vertical axis indicates power in milliwatts, and the horizontal axis shows the supply voltage VDD. As depicted, the prior art circuit consumes 1.99 mW at a VDD of 0.6V, and consumes 8.2 mw at a VDD of 1.2V, a variation of 6.21 mw. By comparison, the circuit of FIG. 3 consumes 1.83 mw at a VDD of 0.6V, and consumes 4.96 mw at a VDD of 1.2V, a variation of 3.13 mw.

The techniques provided herein therefore provide many advantages when employed with CML buffers and transmitters. The chip area employed is less than solutions that use an on-chip resistor. The techniques herein may be employed at supply voltages where BGR solutions do not function. The jitter performance is greatly improved over voltage divider solutions. The power consumption is also improved across the performance range, but especially at higher supply voltages. While performance data for individual CML buffer circuits is shown in FIGS. 6-8, when the improvements are accumulated from many instances of the buffer circuit in CMOS to CML converters (transmitters) and CML buffers used throughout a CML system such as a reference clock distribution system inside an SoC, the accumulated performance improvement is even more significant.

The circuits described herein, or portions thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist includes a set of gates that also represent the functionality of the hardware comprising integrated circuits. The netlist is then placed and routed to produce a data set describing geometric shapes to be applied to masks. The masks are then used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, while a circuit is described using mixed CMOS and CIVIL signaling, the techniques herein can help integrated CIVIL signaling into other digital logic technologies. Further, while a clock distribution system is given as an example application, other signal communication systems may also benefit from the techniques described herein.

Accordingly, it is intended by the appended claims to cover all modifications of the disclosed embodiments that fall within the scope of the disclosed embodiments.

What is claimed is:

1. A reference voltage generation circuit for use with current mode logic, comprising:
    a first transistor of a first conductivity type configured to operate as a diode-connected resistor with a source terminal coupled to a first voltage supply terminal for conducting a supply voltage and a gate terminal coupled to a drain terminal;
    second and third transistors of a second conductivity type coupled in series between the drain terminal of the first transistor and a second voltage supply terminal, with gate terminals of the second and third transistors coupled to the gate terminal of the first transistor; and
    an output terminal coupled between the second and third transistors for supplying a reference voltage; and
    wherein the second and third transistors are sized such that they remain in sub-threshold mode operation during operation with an expected range of the supply voltage.

2. The reference voltage generation circuit of claim 1, further comprising:
    a current reference branch including a first transistor having a source terminal coupled to the supply voltage, a drain terminal connected to one or more series resistors, and a gate terminal coupled to an input terminal; and
    an operational amplifier having a negative input terminal coupled to the output terminal, a positive input terminal coupled to a positive terminal of one of the one or more series resistors of the current reference branch, and an output terminal coupled to the input terminal of the current reference branch.

3. The reference voltage generation circuit of claim 1, wherein the first conductivity type is P-type metal oxide semiconductor (PMOS) and the second conductivity type is N-type metal oxide semiconductor (NMOS).

4. The reference voltage generation circuit of claim 1, wherein the expected range of the supply voltage spans 0.6V to 1.2V.

5. The reference voltage generation circuit of claim 4, wherein the reference voltage varies less than 10 millivolts as the supply voltage varies from 0.6V to 1.2V.

6. The reference voltage generation circuit of claim 1, wherein the second transistor has a width W1 and a length L1 and the third transistor has a width W2 and a length L2 such that (W1/L1)/(W2/L2) is at least 30.

7. The reference voltage generation circuit of claim 6, wherein (W1/L1)/(W2/L2) is at least 50.

8. A current mode logic driver circuit with reference voltage generation capability, comprising:
    a current reference branch including a first transistor having a source terminal coupled to a first supply voltage terminal for conducting a supply voltage, a drain terminal connected to one or more series resistors, and a gate terminal coupled to an input terminal;
    a voltage reference branch including (i) a first transistor of a first conductivity type configured to operate as a diode-connected resistor with a source terminal coupled to a supply voltage and a gate terminal coupled to a drain terminal, (ii) second and third transistors of a second conductivity type coupled in series between the first transistor and a second supply voltage terminal, with gate terminals of the second and third transistors coupled to the gate terminal of the first transistor, and (iii) an output terminal coupled between the second and third transistors for supplying a reference voltage, wherein the second and third transistors are sized such that they remain in sub-threshold mode during operation of the voltage reference branch with an expected range of the supply voltage;
    an operational amplifier having a negative input terminal coupled to the output terminal of the voltage reference branch, a positive input terminal coupled to a positive terminal of one of the one or more series resistors of the current reference branch, and an output terminal coupled to the input terminal of the current reference branch; and
    a current mode logic output stage including a bias voltage input terminal coupled to the output terminal of the operational amplifier to create a current mirror to the current reference branch, first and second voltage input terminals, and first and second differential output terminals for driving a differential load.

9. The current mode logic driver circuit of claim 8, wherein the first conductivity type is P-type metal oxide semiconductor (PMOS) and the second conductivity type is N-type metal oxide semiconductor (NMOS).

10. The current mode logic driver circuit of claim 8, wherein the expected range of the supply voltage spans 0.6V to 1.2V.

11. The current mode logic driver circuit of claim 8, wherein the current mode logic output stage operates to maintain a delay variation of less than 5 picoseconds as the supply voltage varies from 0.6V to 1.2V.

12. The current mode logic driver circuit of claim 8, wherein the current mode logic output stage is configured to receive a reference clock signal on the first and second voltage input terminals, and retransmit the reference clock signal on the first and second differential output terminals.

13. The current mode logic driver circuit of claim 8, wherein the current mode logic driver circuit is configured as a current mode logic transmitter receiving a single-ended signal on the first and second voltage input terminals and transmitting a differential output signal on the first and second differential output terminals.

14. The current mode logic driver circuit of claim 8, wherein the current mode logic driver circuit is configured as a current mode logic buffer receiving a differential input on the first and second voltage input terminals.

15. The current mode logic driver circuit of claim 8, wherein the second transistor has a width W1 and a length L1 and the third transistor has a width W2 and a length L2 such that (W1/L1)/(W2/L2) is at least 30.

16. A method of generating a reference voltage for a current mode logic circuit, comprising:
    applying a supply voltage to a series combination of a first transistor of a first conductivity type followed by second and third transistors of a second conductivity type;

operating the first transistor in a diode-connected resistor configuration with its gate terminal connected to its drain terminal;

operating the second and third transistors in a subthreshold region of operation with gate terminals of the second and third transistors coupled to the gate terminal of the first transistor;

allowing the supply voltage to vary under load and temperature variations and maintaining the second and third transistors in the subthreshold region of operation across an expected range of supply voltage variation; and while operating the second and third transistors in the subthreshold region of operation, obtaining a reference voltage between the second and third transistors substantially independent of the supply voltage variation.

17. The method of claim 16, further comprising allowing the supply voltage to vary at least through a range of 0.6V to 1.2V.

18. The method of claim 16, wherein the first conductivity type is P-type metal oxide semiconductor (PMOS) and the second conductivity type is N-type metal oxide semiconductor (NMOS).

19. The method of claim 16, further comprising:

applying the reference voltage the reference voltage to a current mode logic driver circuit; and maintaining a delay variation of the current mode logic driver circuit of less than 1 picosecond as the supply voltage varies from 0.8V to 1.0V.

20. The method of claim 16, further comprising:

applying the reference voltage to a current mode logic driver circuit; and maintaining a delay variation of the current mode logic driver circuit of less than 5 picoseconds as the supply voltage varies from 0.6V to 1.2V.

* * * * *